(12) United States Patent
Lee

(10) Patent No.: US 10,276,632 B2
(45) Date of Patent: Apr. 30, 2019

(54) DISPLAY DEVICE USING SEMICONDUCTOR LIGHT-EMITTING DIODES, AND MANUFACTURING METHOD THEREFOR

(71) Applicant: LG ELECTRONICS INC., Seoul (KR)

(72) Inventor: Eunah Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/576,186

(22) PCT Filed: Sep. 2, 2015

(86) PCT No.: PCT/KR2015/009231
§ 371 (c)(1),
(2) Date: Nov. 21, 2017

(87) PCT Pub. No.: WO2016/195165
PCT Pub. Date: Dec. 8, 2016

(65) Prior Publication Data
US 2018/0138235 A1 May 17, 2018

(30) Foreign Application Priority Data
Jun. 3, 2015 (KR) .................. 10-2015-0078710

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/36* (2013.01); *H01L 33/62* (2013.01); *Y02B 20/48* (2013.01)

(58) Field of Classification Search
CPC .......................... H01L 27/156; H01L 33/005
(Continued)

(56) References Cited

U.S. PATENT DOCUMENTS 8,017,967 B2 * 9/2011 Suehiro ............... H01L 23/3121
257/99
8,362,514 B2  1/2013 Hwang
(Continued)

FOREIGN PATENT DOCUMENTS

EP   2 270 881 A2   1/2011

*Primary Examiner* — Igwe U Anya
(74) *Attorney, Agent, or Firm* — Birch, Stewart, Kolasch & Birch, LLP

(57) ABSTRACT

The present invention relates to a display device and, particularly, to a display device using semiconductor light-emitting diodes. In the display device according to the present invention, at least one of the semiconductor light-emitting diodes comprises: a first conductive electrode and a second conductive electrode; a first conductive semiconductor layer having the first conductive electrode arranged thereon; a second conductive semiconductor layer overlapping with the first conductive semiconductor layer in a vertical direction, and having the second conductive electrode arranged thereon; and an active layer arranged between the first conductive semiconductor layer and the second conductive semiconductor layer, wherein a connecting unit electrically connected to the first conductive electrode is formed on one surface of the first conductive semiconductor layer, and the connecting unit is arranged so as to lean to one side on the basis of the second conductive electrode along the horizontal direction.

16 Claims, 17 Drawing Sheets

(51) Int. Cl.
*H01L 33/36* (2010.01)
*H01L 33/62* (2010.01)

(58) Field of Classification Search
USPC .......................................................... 257/88
See application file for complete search history.

(56) References Cited

U.S. PATENT DOCUMENTS

| | | |
|---|---|---|
| 8,564,010 B2 | 10/2013 | Chuang et al. |
| 2006/0202211 A1* | 9/2006 | Ueda ................... H01L 33/0079 257/79 |
| 2007/0145391 A1 | 6/2007 | Baik et al. |
| 2010/0032701 A1* | 2/2010 | Fudeta ..................... H01L 33/46 257/98 |
| 2011/0024776 A1* | 2/2011 | Kim ....................... H01L 33/382 257/94 |
| 2012/0061704 A1* | 3/2012 | Jeong ................... H01L 33/387 257/98 |
| 2012/0113673 A1* | 5/2012 | Na .......................... H01L 33/14 362/602 |
| 2013/0214294 A1 | 8/2013 | Yang |

* cited by examiner

DISPLAY DEVICE USING SEMICONDUCTOR LIGHT-EMITTING DIODES, AND MANUFACTURING METHOD THEREFOR

CROSS REFERENCE TO RELATED APPLICATIONS

This application is the National Phase of PCT International Application No. PCT/KR2015/009231, filed on Sep. 2, 2015, which claims priority under 35 U.S.C. 119(a) to Patent Application No. 10-2015-0078710, filed in Republic of Korea on Jun. 3, 2015, all of which are hereby expressly incorporated by reference into the present application.

BACKGROUND OF THE INVENTION

1. Field of the Invention

The present disclosure relates to a display device and a manufacturing method thereof, and more particularly, to a flexible display device using a semiconductor light-emitting diode.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light-emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light-emitting diodes (LEDs) are well known light-emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting diodes may be used to implement a flexible display, thereby presenting a scheme for solving the problems.

The flexible display using the semiconductor light-emitting diode may need to improve a luminous efficiency of the semiconductor light-emitting diode. In particular, when a vertically-structured semiconductor light-emitting diode having a vertical structure is used at a higher resolution, a portion covered by electrode wiring may be formed on a light-emitting surface thereof, thereby resulting in optical loss. Accordingly, the present disclosure may provide a mechanism for solving the optical loss due to the electrode wiring to improve the luminous efficiency in the display device.

SUMMARY OF THE INVENTION

An object of the present disclosure is to provide a structure for improving luminance in a display device and a method of manufacturing the same.

Another object of the present disclosure is to mitigate or prevent light loss due to electrode wiring of vertically-structured semiconductor light-emitting diodes.

A display device according to the present disclosure may include a plurality of semiconductor light-emitting diodes, and at least one of the semiconductor light-emitting diodes may include a first conductive electrode and a second conductive electrode, a first conductive semiconductor layer on which the first conductive electrode is disposed, a second conductive semiconductor layer configured to overlap with the first conductive semiconductor layer in a vertical direction, on which the second conductive electrode is disposed, and an active layer disposed between the first conductive semiconductor layer and the second conductive semiconductor layer. A connection portion electrically connected to the first conductive electrode may be formed on one surface of the first conductive semiconductor layer, and the connection portion may be disposed to be biased to one side with respect to the second conductive electrode along a horizontal direction.

According to an embodiment, at least one of the semiconductor light-emitting diodes may be configured to flow a current between the first conductive electrode and the second conductive electrode to a portion of the active layer facing the connection portion in a biased manner as the connecting portion is biased to one side.

The portion of the active layer facing the connection portion may be disposed in such a manner that the connection portion is adjacent to one side of at least one of the semiconductor light-emitting diodes, and the second conductive electrode is adjacent to the other side thereof not to overlap with the second conductive electrode.

According to an embodiment, the first conductive semiconductor layer may be formed with a current limiting portion that prevents current from flowing to the first conductive electrode.

The current limiting portion may be formed at a position that overlaps with the second conductive electrode in the vertical direction. A region covered by the first conductive electrode may be formed on one surface of the first conductive semiconductor layer, and the connection portion and the current limiting portion are respectively positioned in the covering region. The current limiting portion may include a dielectric disposed between the first conductive electrode and the first conductive semiconductor layer. The current limiting portion may be a portion in which at least part of one surface of the first conductive semiconductor layer is insulated by a plasma treatment.

According to an embodiment, the first conductive electrode and the second conductive electrode may be disposed so as not to overlap with each other along the vertical direction.

In addition, the present disclosure discloses a method of manufacturing a display device, and the method may include growing a first conductive semiconductor layer, an active layer, and a second conductive semiconductor layer on a substrate; isolating semiconductor light-emitting diodes on the substrate through etching; depositing a first conductive electrode on one surface of the first conductive semiconductor layer of the semiconductor light-emitting diodes; and connecting the first conductive electrode to a wiring substrate and forming a second conductive electrode on the second conductive semiconductor layer, wherein a connection portion electrically connected to the first conductive electrode is formed on one surface of the first conductive semiconductor layer, and the connection portion is disposed to be biased to one side with respect to the second conductive electrode along a horizontal direction.

In a display device according to the present disclosure, a non-light-emitting region may be intentionally formed on a semiconductor light-emitting diode to control current distribution on a light-emitting surface thereof. Through this, a current may be biased to a portion that is not covered by a wiring electrode, and as a result, light may be efficiently dispersed. As described above, the present disclosure may mitigate or prevent light loss around the wiring electrode using the non-light-emitting region, and as a result, the luminance of the display device may be greatly improved.

Furthermore, when a width of the wiring electrode on the light-emitting surface is reduced to reduce a light loss region, an operating voltage of the semiconductor light-emitting diode rises to deteriorate the device, but according to the present disclosure, it may be possible to reduce the light loss region while maintaining the width of the wiring electrode.

In addition, the non-light-emitting region may be simply implemented by a dielectric, a plasma process, or the like, and accordingly, the present disclosure may implement a mechanism in which brightness is improved though it has a simple structure.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
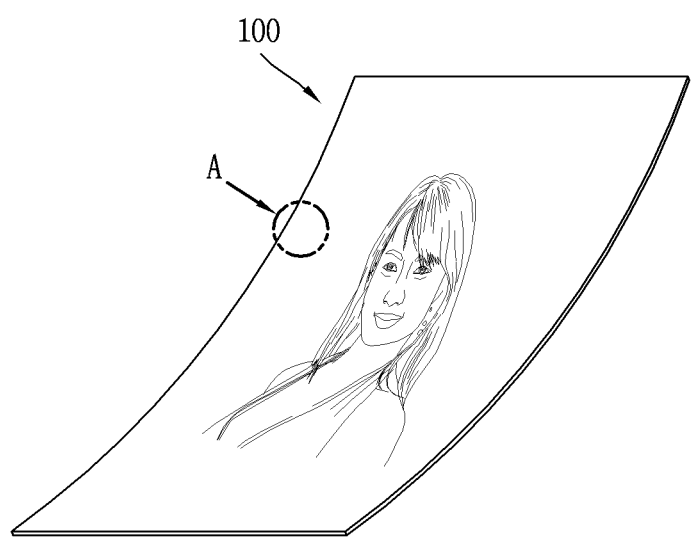
FIG. 1 is a conceptual view illustrating a display device using a semiconductor light-emitting diode according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light-emitting diode according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light-emitting diode. According to the present disclosure, a light-emitting diode (LED) is illustrated as a type of semiconductor light-emitting diode. The light-emitting diode may be formed with a small size to perform the role of a sub-pixel even in the second configuration through this.

Hereinafter, a flexible display implemented using the light-emitting diode will be described in more detail with reference to the accompanying drawings.

Figure 2:
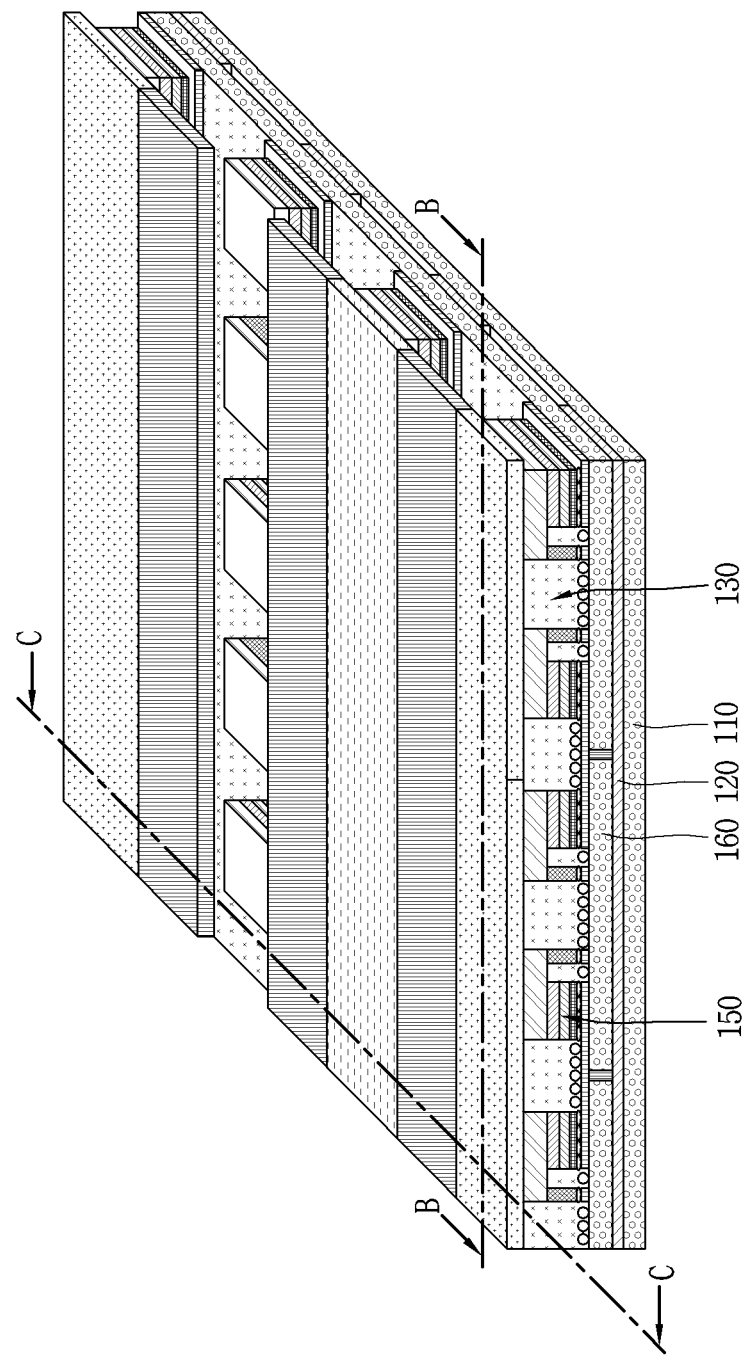
FIG. 2 is a partial enlarged view of portion "A" in FIG. 1, and FIGS. 3A and 3B are cross-sectional views taken along lines B-B and C-C in FIG. 2.
Figure 3A:
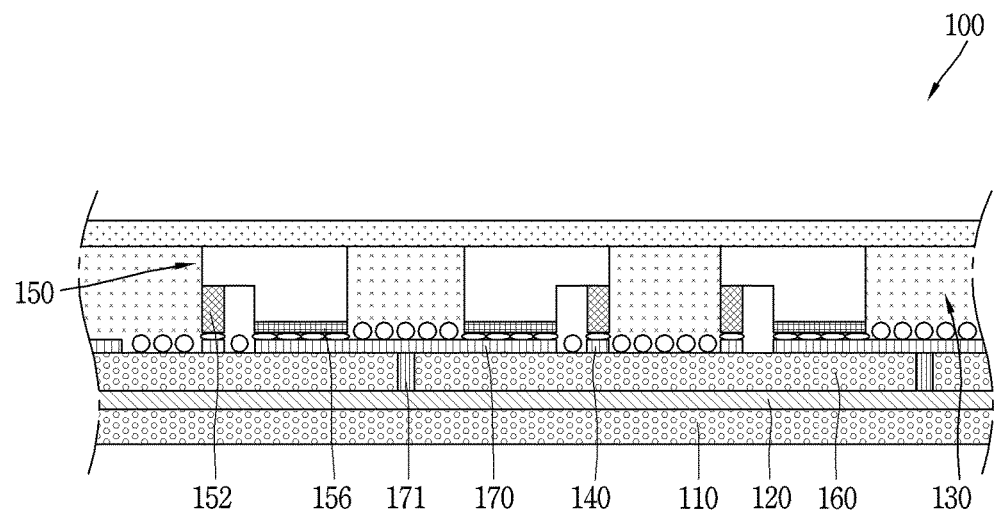
Figure 3B:
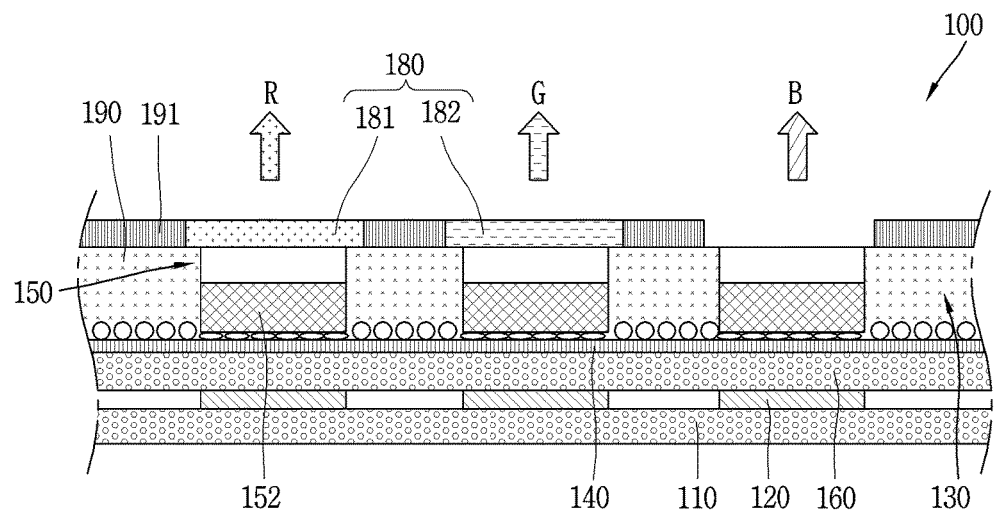
Figure 4:
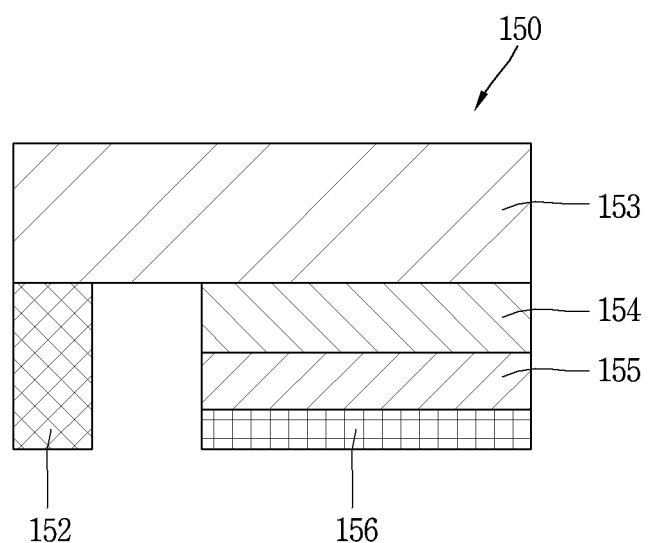
FIG. 4 is a conceptual view illustrating a flip-chip type semiconductor light-emitting diode in FIGS. 3A and 3B.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting diode in FIG. 3A, and FIGS. 5A through 5C are conceptual views illustrating various forms for implementing colors in connection with a flip-chip type semiconductor light-emitting diode.

According to the drawings in FIGS. 2, 3A and 3B, there is illustrated a display device 100 using a passive matrix (PM) type semiconductor light-emitting diode as a display device 100 using a semiconductor light-emitting diode. However, an example described below may also be applicable to an active matrix (AM) type semiconductor light-emitting diode.

The display device 100 may include a substrate 110, a first electrode 120, a conductive adhesive layer 130, a second electrode 140, and a plurality of semiconductor light-emitting diodes 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light-emitting diode 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting diode 150 is connect thereto in a flip chip form with the application of heat and pressure, the semiconductor light-emitting diode 150 is electrically connected to the first electrode 120 and second electrode 140.

Referring to FIG. 4, the semiconductor light-emitting diode may be a flip chip type semiconductor light-emitting diode.

For example, the semiconductor light-emitting diode may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting diodes 150. For example, the left and right p-type electrodes of the semiconductor light-emitting diodes around the auxiliary electrode may be electrically connected to one auxiliary electrode.

More specifically, the semiconductor light-emitting diode 150 is pressed into the conductive adhesive layer 130, and through this, only a portion between the p-type electrode 156 and auxiliary electrode 170 of the semiconductor light-emitting diode 150 and a portion between the n-type electrode 152 and second electrode 140 of the semiconductor light-emitting diode 150 have conductivity, and the remaining portion does not have conductivity since there is no push-down of the semiconductor light-emitting diode. As described above, the conductive adhesive layer 130 may form an electrical connection as well as allow a mutual coupling between the semiconductor light-emitting diode 150 and the auxiliary electrode 170 and between the semiconductor light-emitting diode 150 and the second electrode 140.

Furthermore, a plurality of semiconductor light-emitting diodes 150 constitute a light-emitting array, and a phosphor layer 180 is formed on the light-emitting array.

The light-emitting device array may include a plurality of semiconductor light-emitting diodes with different self luminance values. Each of the semiconductor light-emitting diodes 150 constitutes a sub-pixel, and is electrically connected to the first electrode 120. For example, there may exist a plurality of first electrodes 120, and the semiconductor light-emitting diodes are arranged in several rows, for instance, and each row of the semiconductor light-emitting diodes may be electrically connected to any one of the plurality of first electrodes.

Furthermore, the semiconductor light-emitting diodes may be connected in a flip chip form, and thus semiconductor light-emitting diodes grown on a transparent dielectric substrate. Furthermore, the semiconductor light-emitting diodes may be nitride semiconductor light-emitting diodes, for instance. The semiconductor light-emitting diode 150 has an excellent luminance characteristic, and thus it may be possible to configure individual sub-pixels even with a small size thereof.

According to the drawing, a partition wall 190 may be formed between the semiconductor light-emitting diodes 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light-emitting diode 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light-emitting diode 150. For example, the semiconductor light-emitting diode 150 is a blue semiconductor light-emitting diode that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting diode 151 at a location implementing a red sub-pixel, and a green phosphor 182 capable of converting blue light into green (G) light may be deposited on the blue semiconductor light-emitting diode 151 at a location implementing a green sub-pixel. Furthermore, only the blue semiconductor light-emitting diode 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure may not be necessarily limited to this, and the semiconductor light-emitting diode 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
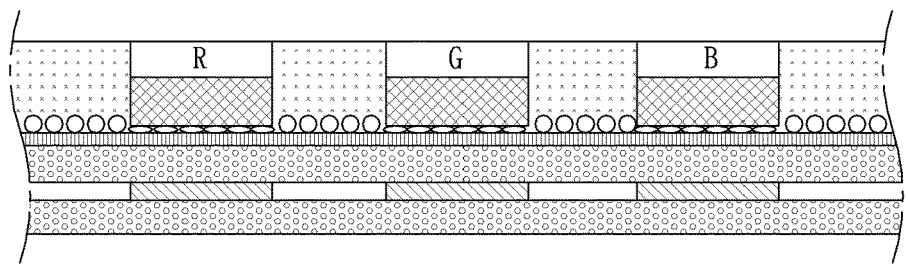
FIGS. 5A through 5C are conceptual views illustrating various forms for implementing colors in connection with a flip-chip type semiconductor light-emitting diode.

Referring to FIG. 5A, each of the semiconductor light-emitting diodes 150 may be implemented with a high-power light-emitting device that emits various lights including blue in which gallium nitride (GaN) is mostly used, and indium (In) and or aluminum (Al) are added thereto.

In this case, the semiconductor light-emitting diode 150 may be red, green and blue semiconductor light-emitting diodes, respectively, to implement each sub-pixel. For instance, red, green and blue semiconductor light-emitting diodes (R, G, B) are alternately disposed, and red, green and blue sub-pixels implement one pixel by means of the red, green and blue semiconductor light-emitting diodes, thereby implementing a full color display.

Figure 5B:
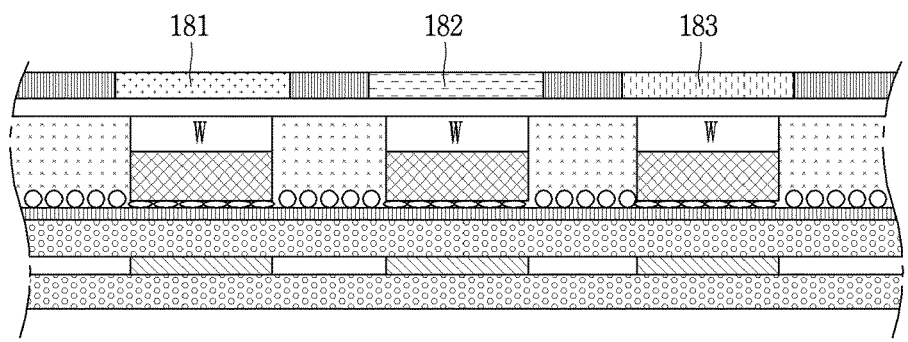

Referring to FIG. 5B, the semiconductor light-emitting diode may have a white light-emitting device (W) provided with a yellow phosphor layer for each element. In this case, a red phosphor layer 181, a green phosphor layer 182 and blue phosphor layer 183 may be provided on the white light-emitting device (W) to implement a sub-pixel. Furthermore, a color filter repeated with red, green and blue on the white light-emitting device (W) may be used to implement a sub-pixel.

Figure 5C:
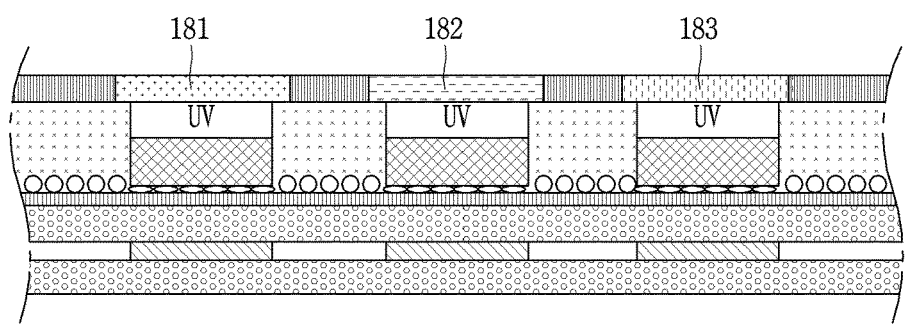

Referring to FIG. 5C, it may be possible to also have a structure in which a red phosphor layer 181, a green phosphor layer 182 and blue phosphor layer 183 may be provided on a ultra violet light-emitting device (UV). In this manner, the semiconductor light-emitting diode can be used over the entire region up to ultra violet (UV) as well as visible light, and may be extended to a form of semiconductor light-emitting diode in which ultra violet (UV) can be used as an excitation source.

Taking the present example into consideration again, the semiconductor light-emitting diode 150 is placed on the conductive adhesive layer 130 to configure a sub-pixel in the display device. The semiconductor light-emitting diode 150 may have excellent luminance characteristics, and thus it may be possible to configure individual sub-pixels even with a small size thereof. The size of the individual semiconductor light-emitting diode 150 may be less than 80 µm in the length of one side thereof, and formed with a rectangular or square shaped element. In case of a rectangular shaped element, the size thereof may be less than 20×80 µm.

Furthermore, even when a square shaped semiconductor light-emitting diode 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light-emitting diodes becomes sufficiently large. Accordingly, in this case, it may be possible to implement a flexible display device having a HD image quality.

A display device using the foregoing semiconductor light-emitting diode will be fabricated by a new type of fabrication method. Hereinafter, the fabrication method will be described with reference to FIG. 6.

Figure 6:
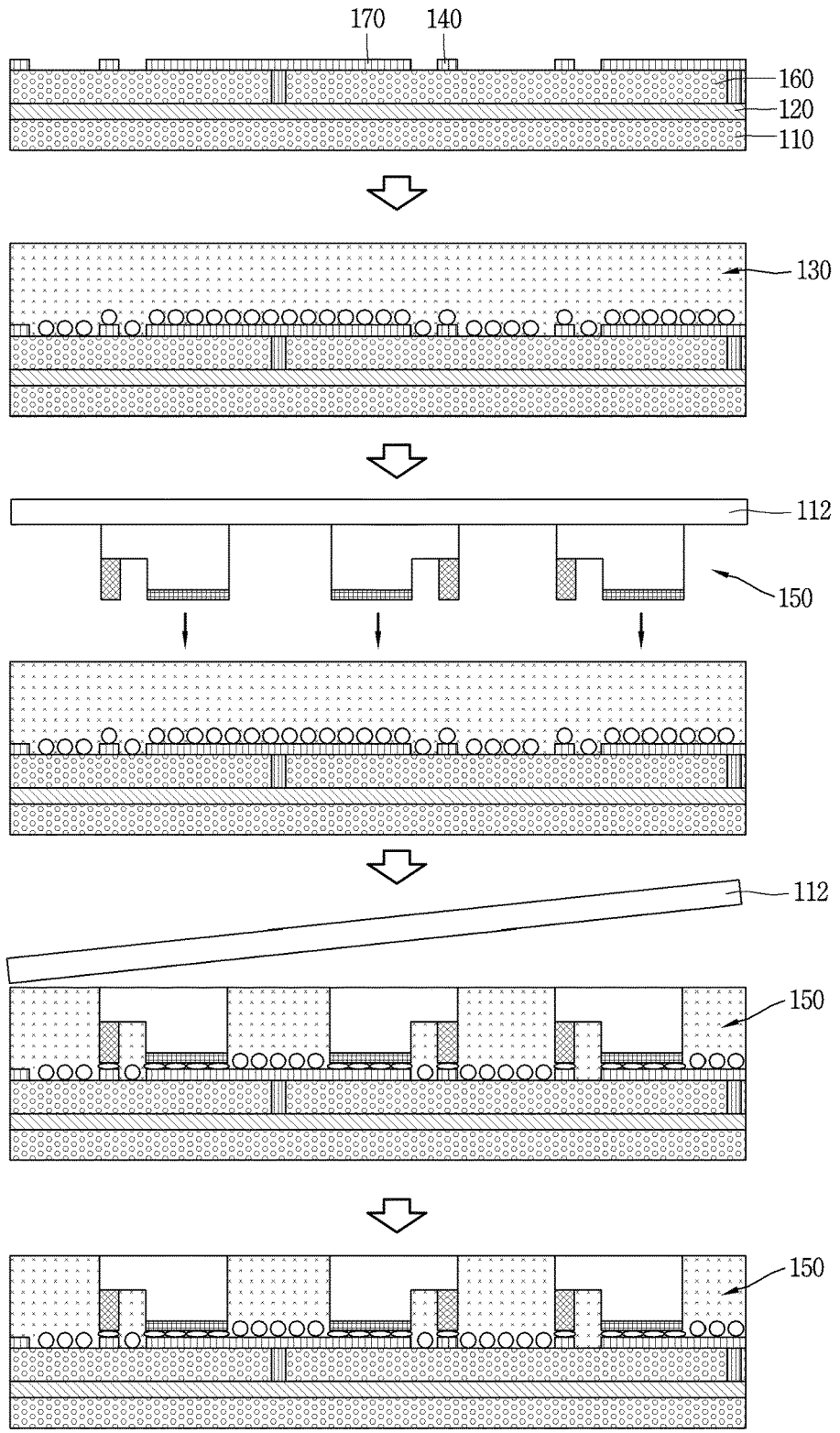
FIG. 6 is cross-sectional views illustrating a fabrication method of a display device using a semiconductor light-emitting diode according to the present disclosure.

FIG. 6 is cross-sectional views illustrating a fabrication method of a display device using a semiconductor light-emitting diode according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting diodes 150 corresponding to the location of the auxiliary electrodes 170 and second electrodes 140 and constituting individual pixels is disposed such that the semiconductor light-emitting diode 150 faces the auxiliary electrode 170 and second electrode 140.

In this case, the second substrate 112 as a growth substrate for growing the semiconductor light-emitting diode 150 may be a sapphire substrate or silicon substrate.

The semiconductor light-emitting diode may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting diode 150 and the auxiliary electrode 170 and second electrode 140 may have conductivity due to the characteristics of an anisotropic conductive film having conductivity by thermal compression, thereby allowing the electrodes and semiconductor light-emitting diode 150 to be electrically connected to each other. At this time, the semiconductor light-emitting diode 150 may be inserted into the anisotropic conductive film, thereby forming a partition wall between the semiconductor light-emitting diodes 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting diodes 150 to the outside. Silicon oxide (SiOx) or the like may be coated on the wiring substrate coupled to the semiconductor light-emitting diode 150 to form a transparent insulating layer (not shown).

Furthermore, it may further include the process of forming a phosphor layer on one surface of the semiconductor light-emitting diode 150. For example, the semiconductor light-emitting diode 150 may be a blue semiconductor light-emitting diode for emitting blue (B) light, and red or green phosphor for converting the blue (B) light into the color of the sub-pixel may form a layer on one surface of the blue semiconductor light-emitting diode.

The fabrication method or structure of a display device using the foregoing semiconductor light-emitting diode may be modified in various forms. For such an example, the foregoing display device may be applicable to a vertical semiconductor light-emitting diode. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
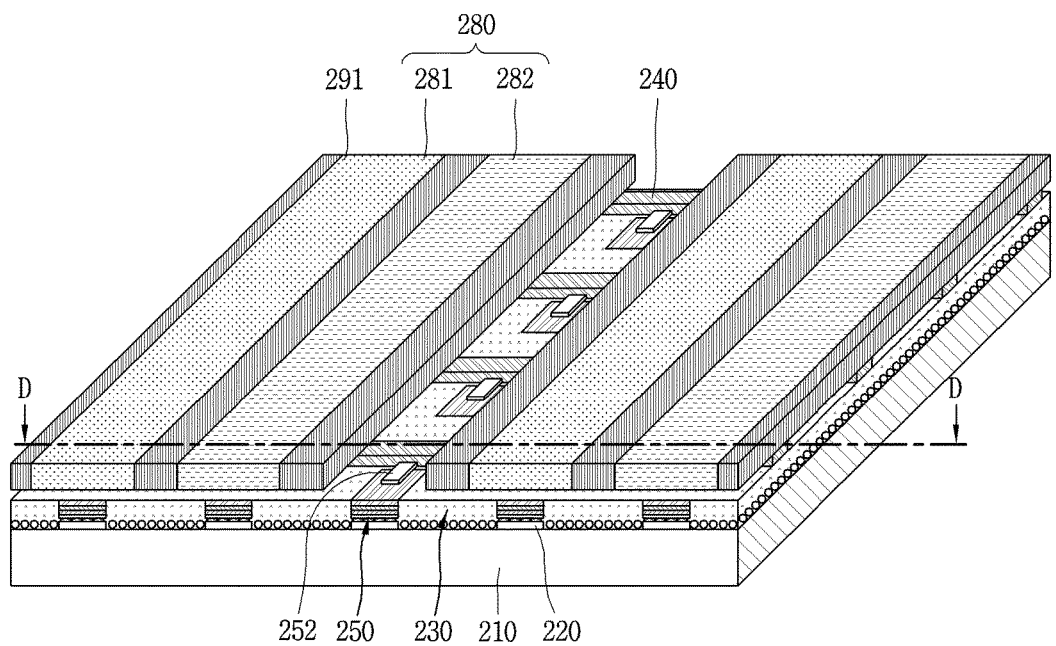
FIG. 7 is a perspective view illustrating a display device using a semiconductor light-emitting diode according to another embodiment of the present disclosure.
Figure 8:
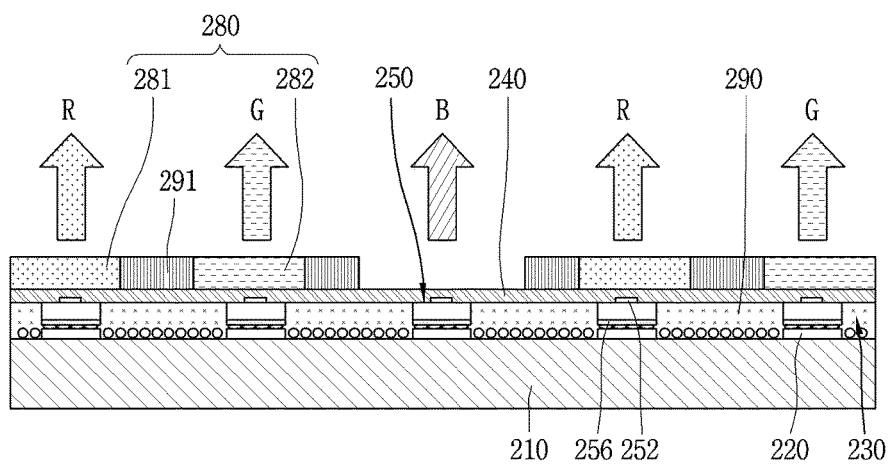
FIG. 8 is a cross-sectional view taken along line D-D in FIG. 7.
Figure 9:
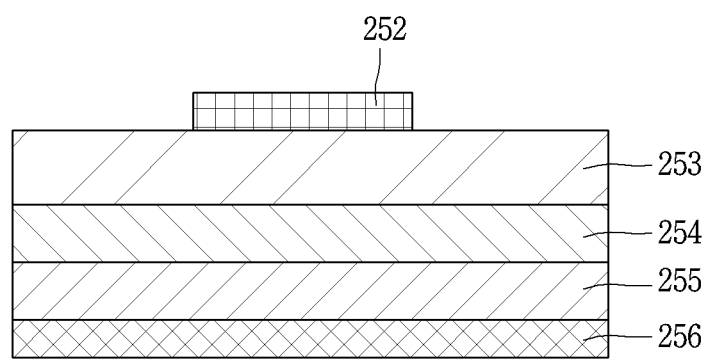
FIG. 9 is a conceptual view illustrating a vertical type semiconductor light-emitting diode in FIG. 8.

FIG. 7 is a perspective view illustrating a display device using a semiconductor light-emitting diode according to another embodiment of the present disclosure. FIG. 8 is a cross-sectional view taken along line C-C in FIG. 7, and FIG. 9 is a conceptual view illustrating a vertical type semiconductor light-emitting diode in FIG. 8.

According to the drawings, the display device may be display device using a passive matrix (PM) type of vertical semiconductor light-emitting diode.

The display device may include a substrate 210, a first electrode 220, a conductive adhesive layer 230, a second electrode 240 and a plurality of semiconductor light-emitting diodes 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display device to which a flip chip type light-emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting diode 250 thereto, the semiconductor light-emitting diode 250 is electrically connected to the first electrode 220. At this time, the semiconductor light-emitting diode 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting diode 250 and the first electrode 220.

In this manner, the semiconductor light-emitting diode 250 is placed on the conductive adhesive layer 230, thereby configuring a separate sub-pixel in the display device. The semiconductor light-emitting diode 250 may have excellent luminance characteristics, and thus it may be possible to configure individual sub-pixels even with a small size thereof. The size of the individual semiconductor light-emitting diode 250 may be less than 80 μm in the length of one side thereof, and formed with a rectangular or square shaped element. In case of a rectangular shaped element, the size thereof may be less than 20×80 μm.

The semiconductor light-emitting diode 250 may be a vertical structure.

A plurality of second electrodes 240 disposed in a direction of crossing the length direction of the first electrode 220, and electrically connected to the vertical semiconductor light-emitting diode 250 may be located between vertical semiconductor light-emitting diodes.

Referring to FIG. 9, the vertical semiconductor light-emitting diode may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting diode 250, thereby providing a great advantage capable of reducing the chip size.

Referring again to FIG. 8, a phosphor layer 280 may be formed on one surface of the semiconductor light-emitting diode 250. For example, the semiconductor light-emitting diode 250 is a blue semiconductor light-emitting diode 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting diode 251 at a location implementing a red sub-pixel, and a green phosphor 282 capable of converting blue light into green (G) light may be deposited on the blue semiconductor light-emitting diode 251 at a location implementing a green sub-pixel. Furthermore, only the blue semiconductor light-emitting diode 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting device is applied.

Taking the present embodiment into consideration again, the second electrode 240 is located between the semiconductor light-emitting diodes 250, and electrically connected to the semiconductor light-emitting diodes 250. For example, the semiconductor light-emitting diodes 250 may be disposed in a plurality of rows, and the second electrode 240 may be located between the rows of the semiconductor light-emitting diodes 250.

Since a distance between the semiconductor light-emitting diodes 250 constituting individual pixels is sufficiently large, the second electrode 240 may be located between the semiconductor light-emitting diodes 250.

The second electrode 240 may be formed with a bar-shaped electrode elongated in one direction, and disposed in a perpendicular direction to the first electrode.

Furthermore, the second electrode 240 may be electrically connected to the semiconductor light-emitting diode 250 by a connecting electrode protruded from the second electrode 240. More specifically, the connecting electrode may be an n-type electrode of the semiconductor light-emitting diode 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting diode 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting diode 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting diode 250, the ITO material has a problem of bad adhesiveness with an n-type semiconductor. Accordingly, the second electrode 240 may be placed between the semiconductor light-emitting diodes 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting diodes 250. In other words, the partition wall 290 may be disposed between the vertical semiconductor light-emitting diodes 250 to isolate the semiconductor light-emitting diode 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting diode 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light-emitting diodes 250, the partition wall 290 may be located between the semiconductor light-emitting diode 250 and second electrode 240. Accordingly, individual sub-pixels may be configured even with a small size using the semiconductor light-emitting diode 250, and a distance between the semiconductor light-emitting diodes 250 may be relatively sufficiently large to place the second electrode 240 between the semiconductor light-emitting diodes 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light-emitting diode 250 is located on the conductive adhesive layer 230, thereby constituting individual pixels on the display device. The semiconductor light-emitting diode 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light-emitting diode.

The above-described display device of the present disclosure has a problem that it is difficult to increase the luminance of the display device due to a small size of the semiconductor light-emitting diode. In particular, in a display device to which a horizontally-structured semiconductor light-emitting diode is applied, there is no portion covered by electrode wiring on the light-emitting surface. However, in a display device to which a vertically-structured semiconductor light-emitting diode is applied, a problem occurs in which the light-emitting surface is covered by electrode wiring. Specifically, in a horizontally-structured semiconductor light-emitting diode, there is no covered portion since the p-type electrode and the n-type electrode face the wiring substrate, but in a vertically-structured semiconductor light-emitting diode, it has a structure in which the p-type electrode and the n-type electrode are overlapped in a thicknesswise direction, and thus the light-emitting surface is covered by either one of the electrodes. In the present disclosure, a semiconductor light-emitting diode having a new structure capable of solving such a problem will be presented. Hereinafter, a display device to which a semiconductor light-emitting diode having a new structure is applied and a method of manufacturing the same will be described.

Figure 10:
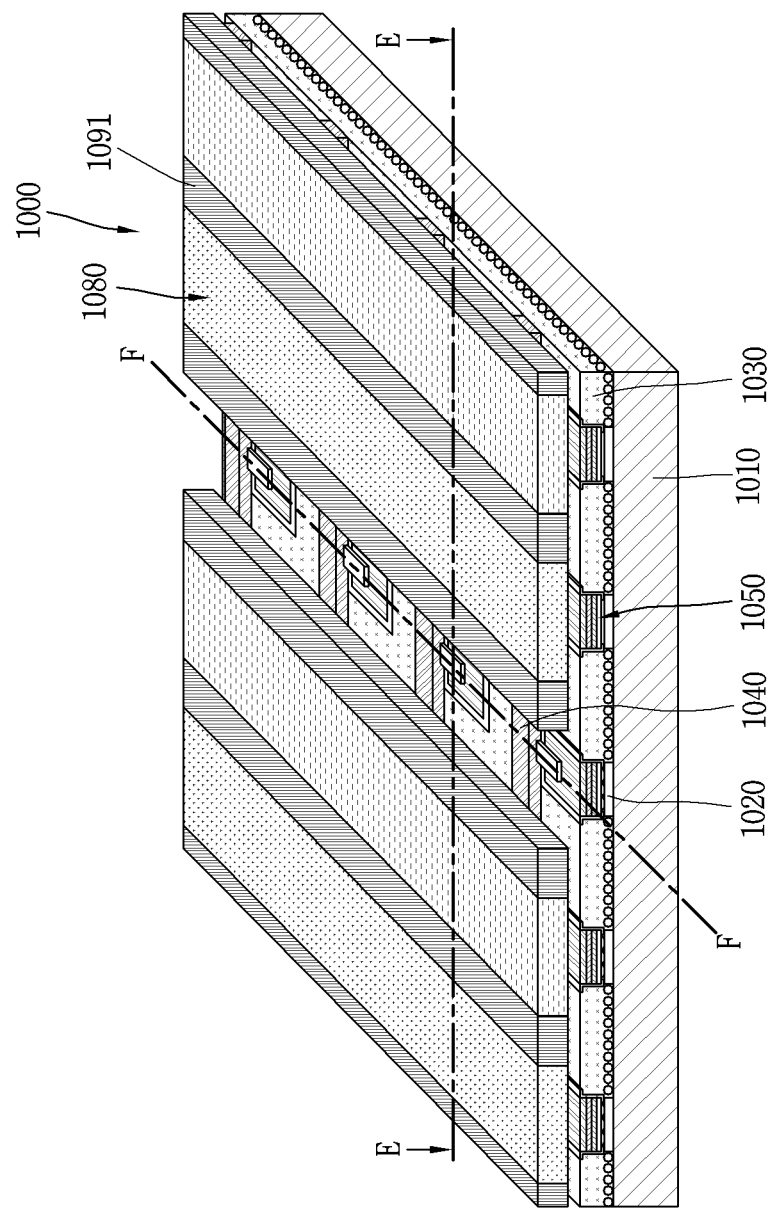
FIG. 10 is an enlarged view of portion "A" in FIG. 1 for explaining another embodiment of the present disclosure to which a semiconductor light-emitting element having a new structure is applied.
Figure 11:
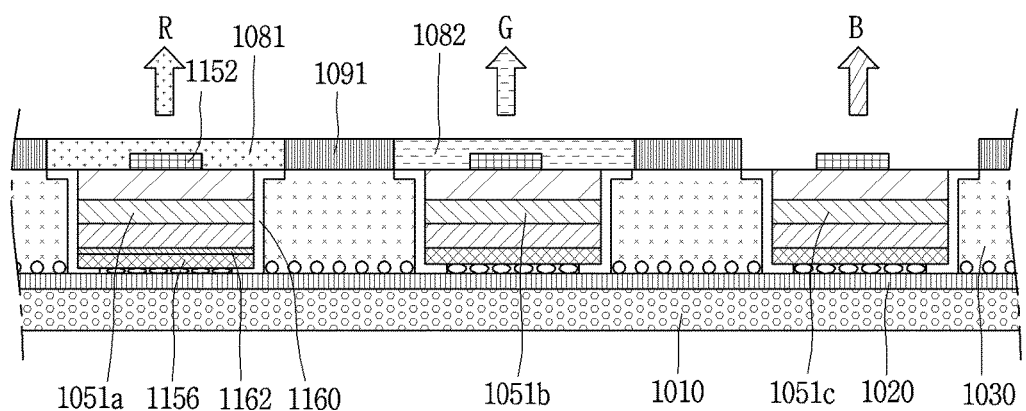
FIG. 11 is a cross-sectional view taken along line E-E in FIG. 10.
Figure 12:
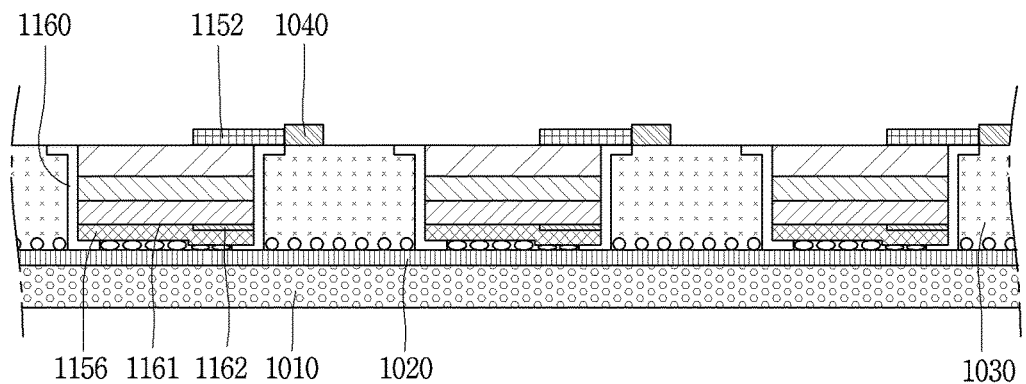
FIG. 12 is a cross-sectional view taken along line F-F in FIG. 10.
Figure 13:
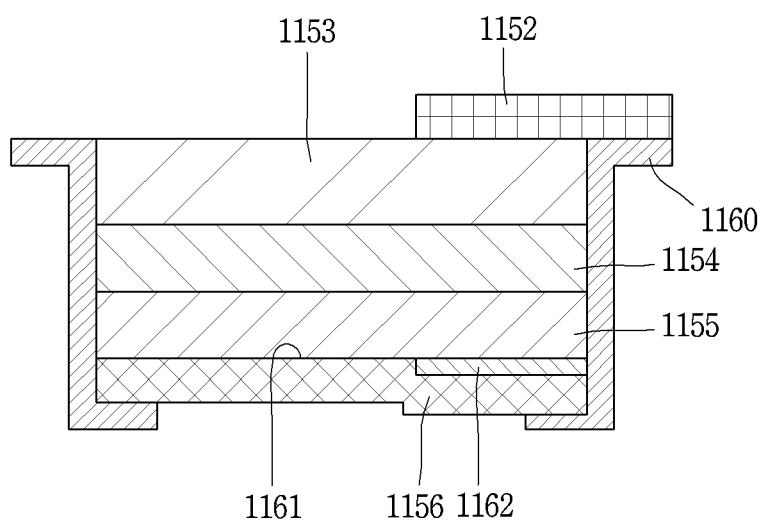
FIG. 13 is a conceptual view illustrating a semiconductor light-emitting diode having a new structure in FIG. 11.
Figure 14A:
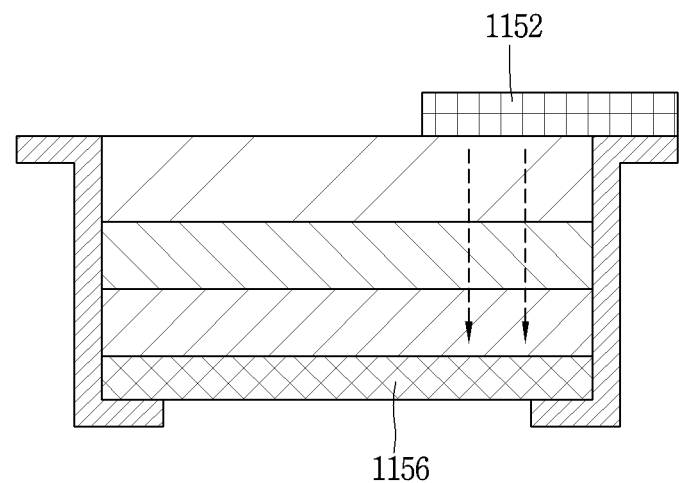
FIGS. 14A and 14B are a current flowchart that compares the display device of FIG. 10 with a display device in the related art.
Figure 14B:
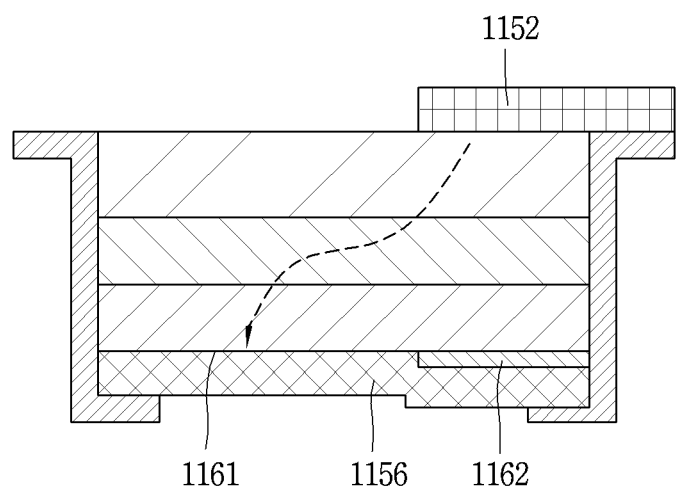
Figure 15:
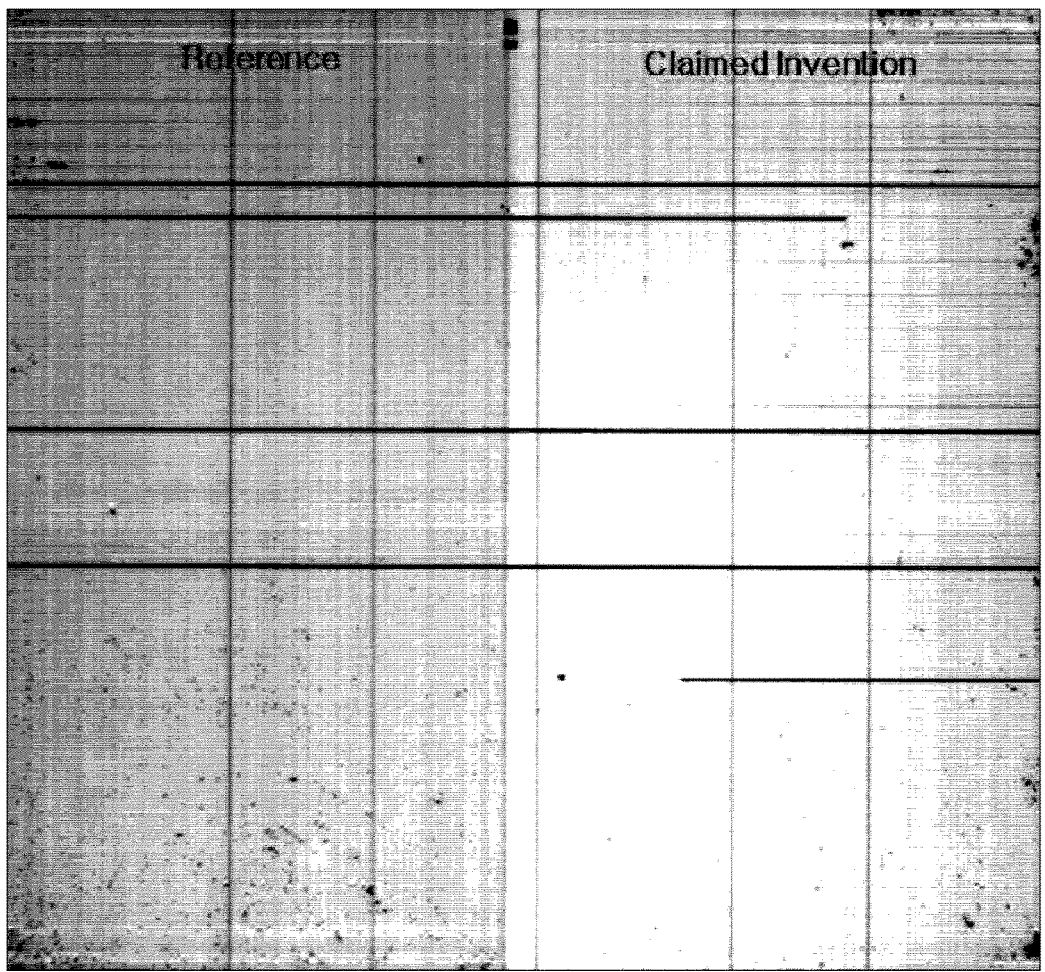
FIG. 15 is a photograph that compares the display device of FIG. 10 with the related art.

FIG. 10 is an enlarged view of portion "A" in FIG. 1 for explaining another embodiment of the present disclosure to which a semiconductor light-emitting to diode having a new structure is applied, FIG. 11 is a cross-sectional view taken along line E-E in FIG. 10, FIG. 12 is a cross-sectional view taken along line F-F in FIG. 10, and FIG. 13 is a conceptual view illustrating a semiconductor light-emitting diode having a new structure in FIG. 11. Furthermore, FIGS. 14A and 14B are a current flowchart that compares the display device of FIG. 10 with a display device in the related art, and FIG. 15 is a photograph that compares the display device of FIG. 10 with the related art.

According to the drawings in FIGS. 10, 11 and 12, there is illustrated a display device 1000 using a passive matrix (PM) type vertical semiconductor light-emitting diode as a display device 1000 using a semiconductor light-emitting diode. However, an example described below may also be applicable to an active matrix (AM) type semiconductor light-emitting diode.

The display device 1000 may include a substrate 1010, a first electrode 1020, a conductive adhesive layer 1030, a second electrode 1040, and a plurality of semiconductor light-emitting diodes 1050. Here, the first electrode 1020 and the second electrode 1040 may respectively include a plurality of electrode lines.

The substrate 1010 as a wiring substrate disposed with the first electrode 1020 may include polyimide (PI) to implement a flexible display device. In addition, any one may be used if it is an insulating and flexible material.

The first electrode 1020 may be located on the substrate 1010, and formed with a bar-shaped electrode elongated in one direction. The first electrode 1020 may be formed to perform the role of a data electrode.

The conductive adhesive layer 1030 is formed on the substrate 1010 located with the first electrode 1020. Similarly to a display device to which the foregoing flip chip type light-emitting device is applied, the conductive adhesive layer 1030 may be an anisotropic conductive film (ACF), an anisotropic conductive paste, a solution containing conductive particles, and the like. However, in the present embodiment, the conductive adhesive layer 1030 may be replaced with an adhesive layer. For example, when the first electrode 1020 is not located on the substrate 1010 but formed integrally with the conductive electrode of the semiconductor light-emitting diode, the adhesive layer may not need to have conductivity.

A plurality of second electrodes 1040 disposed in a direction of crossing the length direction of the first electrode 1020, and electrically connected to the semiconductor light-emitting diode 1050 may be located between the semiconductor light-emitting diodes.

According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected by contact with the semiconductor light-emitting diode 1050.

A plurality of semiconductor light-emitting diodes 1050 are coupled to the conductive adhesive layer 1030, and electrically connected to the first electrode 1020 and the second electrode 1040 by the foregoing structure.

According to circumstances, a transparent insulating layer (not shown) containing silicon oxide (SiOx) may be formed on the substrate 1010 formed with the semiconductor light-emitting diode 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As shown in the drawing, the plurality of semiconductor light-emitting diodes 1050 may form a plurality of columns in a direction parallel to a plurality of electrode lines provided in the first electrode 1020. However, the present disclosure is not necessarily limited thereto. For example, the plurality of semiconductor light-emitting diodes 1050 may form a plurality of columns along the second electrode 1040.

Moreover, the display device 1000 may further include a phosphor layer 1080 formed on one surface of the plurality of semiconductor light-emitting diodes 1050. For example, the semiconductor light-emitting diode 1050 is a blue semiconductor light-emitting diode that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light-emitting diode 1051a at a location implementing a red sub-pixel, and a green phosphor 1082 capable of converting blue light into green (G) light may be deposited on the blue semiconductor light-emitting diode 1051b at a location implementing a green sub-pixel. Furthermore, only the blue semiconductor light-emitting diode 1051c may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light-emitting diode 1050 may be combined with a quantum dot (QD) instead of a phosphor to implement sub-pixels that emit red (R), green (G) and blue (B).

On the other hand, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are layered. In this case, a phosphor layer may not be formed at a position corresponding to the blue semiconductor light-emitting element 1051, but the black matrix 1091 may be respectively formed at both sides thereof by interposing a space that does not have the blue light-emitting device 1051c therebetween. The black matrix 1091 serves as a partition wall to prevent color mixture among the phosphors.

Meanwhile, referring to the semiconductor light-emitting diode 1050 according to the present example, the electrodes may be disposed in an upward/downward direction in the semiconductor light-emitting diode 1050 in the present embodiment, thereby having a great advantage capable of reducing the chip size. However, since the electrodes are disposed on the upper and bottom sides thereof, the light-emitting surface is covered by the electrodes to reduce an area of the light-emitting surface. More specifically, the display device has a front surface on which visual information is displayed, and a portion where the second electrode 1040 and the semiconductor light-emitting diode 1050 are electrically connected blocks light output from the semiconductor light-emitting diode toward the front surface. Therefore, the semiconductor light-emitting diode of the present example has a mechanism for mitigating and preventing the blocking of light, and this mechanism will be described in more detail below.

Referring to FIG. 13, the semiconductor light-emitting diode 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

The first conductive semiconductor layer 1155 and the second conductive semiconductor layer 1153 overlap with each other in a vertical direction (or a thickness direction of the semiconductor light-emitting diode or the display device), and the second conductive electrode 1152 is disposed on an upper surface of the second conductive semiconductor layer 1153, and the first conductive electrode 1156 is disposed on a lower surface of the first conductive semiconductor layer 1155. In this case, the upper surface of the second conductive semiconductor layer 1153 may be one surface of the second conductive semiconductor layer 1153 farthest from the first conductive semiconductor layer 1155, and the lower surface of the first conductive semiconductor layer 1155 may be one surface of the first conductive semiconductor layer 1155 farthest from the second conductive semiconductor layer 1153. In this manner, the first conductive electrode 1156 and the second conductive electrode 1152 are respective disposed on the upper and lower sides of the first conductive semiconductor layer 1155 and the second conductive semiconductor layer 1153 by interposing them therebetween.

Referring to FIG. 13 together with FIGS. 10 through 12, the lower surface of the first conductive semiconductor layer 1155 may be a surface closest to the wiring substrate, and the upper surface of the second conductive semiconductor layer may be a surface farthest from the wiring substrate.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. More specifically, the first conductive semiconductor layer 1155 may be a P-type GaN layer, and the second conductive semiconductor layer 1153 may be an N-type Gan layer.

In this case, the p-type electrode located at the top thereof may be electrically connected to the first electrode 1020 by the conductive adhesive layer 1030, and the n-type electrode 252 located at the bottom thereof may be electrically connected to the second electrode 1040. However, the present disclosure is not limited thereto, and the first conductive type may be n-type and the second conductive type may be p-type.

Here, the semiconductor light-emitting diode may include a passivation layer 1160 formed to surround the lateral surfaces of the first conductive semiconductor layer 1155 and the second conductive semiconductor layer 1153. The passivation layer 1160 covers the lateral surface of the semiconductor light-emitting diode to stabilize the characteristics of the semiconductor light-emitting diode and is formed of an insulating material. As described above, the first conductive semiconductor layer 1155 and the second conductive semiconductor layer 1153 are electrically disconnected by the passivation layer 1160, and thus the p-type GaN and n-type GaN of the semiconductor light-emitting diode may be insulated from each other.

On the other hand, the active layer 1154 is disposed between the first conductive semiconductor layer 1155 and the second conductive semiconductor layer 1153 to emit light by a current flowing between the first conductive electrode 1156 and the second conductive electrode 1152.

In this example, the structure of at least one of the semiconductor light-emitting diodes is formed in such a manner that current flows along a path biased with respect to the vertical direction. For example, as illustrated in the third drawing, a connection portion 1161 electrically connected to the first conductive electrode 1156 is formed on one surface of the first conductive semiconductor layer 1155 (or a lower surface of the first conductive semiconductor layer), and the connection portion 1161 is disposed so as to be biased to one side with respect to the second conductive electrode 1152 along a horizontal direction.

At least one of the semiconductor light-emitting diodes is configured to flow a current between the first conductive electrode 1156 and the second conductive electrode 1152 to a portion of the active layer 1154 facing the connection portion 1161 in a biased manner as the connection portion 1161 is biased to the one side. The portion of the active layer 1154 facing the connection portion 1161 is configured not to overlap with the second conductive electrode, or overlaps only a part of the second conductive electrode. To this end, the portion of the active layer 1154 facing the connection portion 1161 may be disposed in such a manner that the connection portion 1161 is adjacent to one side of at least one of the semiconductor light-emitting diodes, and the second conductive electrode 1152 is adjacent to the other side thereof not to overlap with the second conductive electrode 1152. Therefore, a portion where a large amount of current flows on the light-emitting surface may not overlap with the second conductive electrode 1152 or overlap only a part of the second conductive electrode 1152, thereby increasing the brightness of light.

Referring to FIGS. 10 through 12, the second electrode 1040 and the second conductive electrode 1152 may be connected to each other by an ohmic contact. For example, the second conductive electrode 1152 is formed with an ohmic electrode for ohmic contact, and the second electrode 1040 covers at least part of the ohmic electrode by printing or deposition. Accordingly, an area of the second conductive electrode 1152 may not be as wide as that of the first conductive electrode 1156, and the second conductive electrode 1152 may be disposed adjacent to the other side.

Meanwhile, the first conductive electrode 1156 is disposed to face the first electrode 1020 and electrically connected to the first electrode 1020 by the conductive adhesive layer 1030, thereby having an advantage in the aspect of securing reliability as the area increases. Accordingly, the first conductive electrode 1156 may be configured to overlap with the second conductive electrode 1152 along the vertical direction. In this structure, when the connection portion is formed entirely between the first conductive semiconductor layer 1155 and the first conductive electrode 1156, it may be impossible to obtain an effect of the present example described above.

In order to secure an area of the first conductive electrode 1156 and exhibit the effect of the present example described above, as illustrated in FIG. 13, the first conductive semiconductor layer 1155 may be formed with a current limiting portion 1162 that prevents current from flowing to the first conductive electrode 1156

FIG. 14A illustrates a flow of current in case where there is no current limiting portion, and FIG. 14B illustrates a flow of current in case where a non-light-emitting region is intentionally formed in a region of the p-type GaN layer at a lower portion of the first conductive electrode as in this example. As can be seen from the drawing, light concentrated around the electrode where the current is injected can be dispersed, thereby suppressing light loss.

More specifically, the first conductive electrode 1156 is formed to cover most of one surface of the first conductive semiconductor layer 1155, and the first conductive semiconductor layer 1155 partially overlaps with the second conductive electrode 1152 in a vertical direction, and the current limiting portion 1162 is formed at a position that overlaps with the second conductive electrode in the vertical direction on the first conductive semiconductor layer 1155.

In this case, a region covered by the first conductive electrode 1156 may be formed on one surface of the first conductive semiconductor layer 1155, and the connection portion 1161 and the current limiting portion 1162 may be respectively positioned in the covering region.

On the other hand, the current limiting portion 1162 may include a dielectric through which current does not flow, disposed between the first conductive electrode 1156 and the first conductive semiconductor layer 1155. For example, the dielectric may be $SiO_2$ or SiN deposited on one surface of the first conductive semiconductor layer 1155. For another example, the dielectric may be a transparent and low refractive index material. The dielectric may be used as an omni-directional reflector (ODR) in combination with the first conductive electrode 1156.

The current limiting portion 1162 may be configured to have a width equal to or greater than that of the second conductive electrode 1152 to completely cover the second conductive electrode 1152 in the vertical direction.

For such an example, assuming that a width of an n-electrode is 20% of an area of the light-emitting device in consideration of the operation voltage and the light extraction efficiency of the semiconductor light-emitting diode, it is effective that a width of the current limiting portion should be larger than the n-electrode area, and formed in a range not exceeding 30% of an area of a p-electrode. For a more specific example, a size of individual semiconductor light-emitting diodes is a vertical structure of 20 and 40 um in width and length, a size of the n-electrode is 20 and 8 um in width and length, and a size of the current limiting portion is 20, 8 to 10.4 um in width and length.

As in this example, when a region where no current flows is formed on a lower surface of the p-type GaN layer of the semiconductor light-emitting diode in which current is concentrated, light concentrated around the electrode may be dispersed. FIG. 15 illustrates a result that a region in which an intentional non-light-emitting region exists (a right region in FIG. 15) and a region in which the intentional non-light-emitting region does not exist (a left region in FIG. 15) are applied to manufacture a display panel, as in this example. A size of individual semiconductor light-emitting diodes is a vertical structure of 20 and 40 μm in width and length, and the p-electrode exists at the bottom of the display panel and is connected to p-electrode wiring, and the n-electrode is a light-emitting surface. It is a case where there exists a light loss region in which an area of ¼ is covered by the N wiring electrode on the side of the light-emitting surface.

As can be seen from the right side of FIG. 15, in the case of a display panel configured with a semiconductor light-emitting diode in which an intentional non-emitting region exists, it is seen that a wall plug efficiency (WPE) compared to the case of a reference (a left region of FIG. 15) is increased by about 20%. As described above, the present disclosure may mitigate or prevent light loss around the wiring electrode using the non-light-emitting region, and as a result, the luminance of the display device may be greatly improved.

According to a structure of a new display device as described above, it may be possible to implement a structure for improving luminance.

Hereinafter, a manufacturing method for forming the structure of a new display device as described above will be described in detail with reference to the accompanying drawings. FIGS. 16A, 16B, 16C, 16D, 16E, 17A, 17B and 17C are cross-sectional views illustrating a method of manufacturing a display device using the semiconductor light-emitting diode of the present disclosure.

Figure 16A:
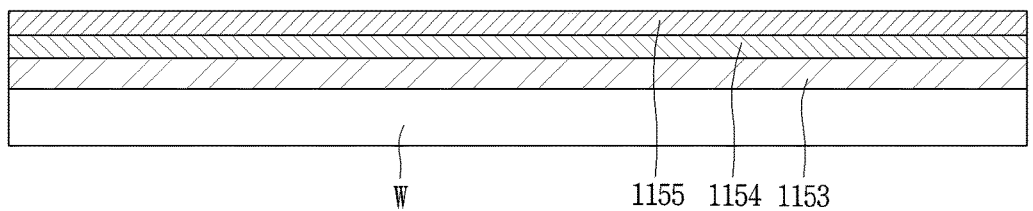
FIGS. 16A, 16B, 16C, 16D, 16E, 17A, 17B and 17C are cross-sectional views illustrating a method of manufacturing a display device using the semiconductor light-emitting diode of the present disclosure.

First, according to a manufacturing method, a second conductive semiconductor layer 1153, an active layer 1154, and a first conductive semiconductor layer 1155 are respectively grown on a growth substrate (W or a semiconductor wafer) (FIG. 16A).

When the second conductive semiconductor layer 1153 is grown, next, the active layer 1154 is grown on the first conductive semiconductor layer 1152, and then the first conductive semiconductor layer 1154 is grown on the active layer 1154. As described above, when the second conductive semiconductor layer 1153, the active layer 1154 and the first conductive semiconductor layer 1155 are sequentially grown, the second conductive semiconductor layer 1153, the active layer 1154, and the first conductive semiconductor layer 1155 form a layer structure.

The growth substrate (W) may be formed of any one of materials having light transmission properties, for example, sapphire ($Al_2O_3$), GaN, ZnO, and AlO, but is not limited thereto. Furthermore, the growth substrate (W) may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

The second conductive semiconductor layer 1153, as an n-type semiconductor layer, may be a nitride semiconductor layer such as n-Gan.

Next, an etching process for separating a p-type semiconductor and an n-type semiconductor, and forming a plurality of isolated semiconductor light-emitting diodes on the substrate is carried out.

Figure 16B:
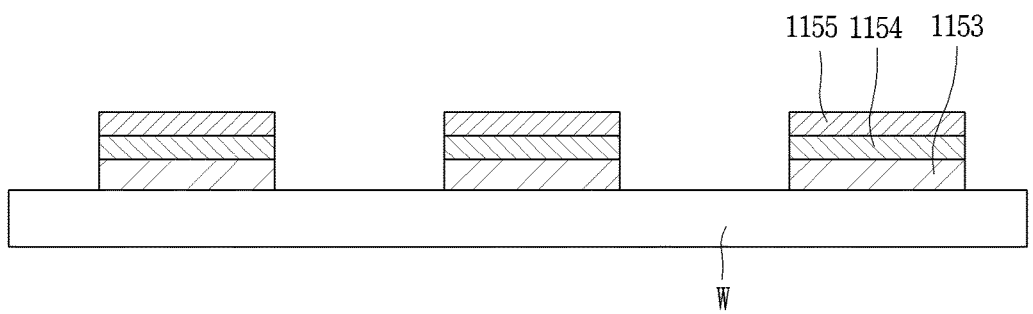

For example, referring to FIG. 16B, at least part of the first conductive semiconductor layer 1155, the active layer 1154 and the second conductive semiconductor layer 1153 is etched to form a plurality of semiconductor light-emitting diodes isolated from each other on the substrate. In this case, the etching may proceed until the substrate is exposed. For another example, etching may proceed to a state in which part of the second conductive semiconductor layer 1153 is left between the semiconductor light-emitting diodes.

Figure 16C:
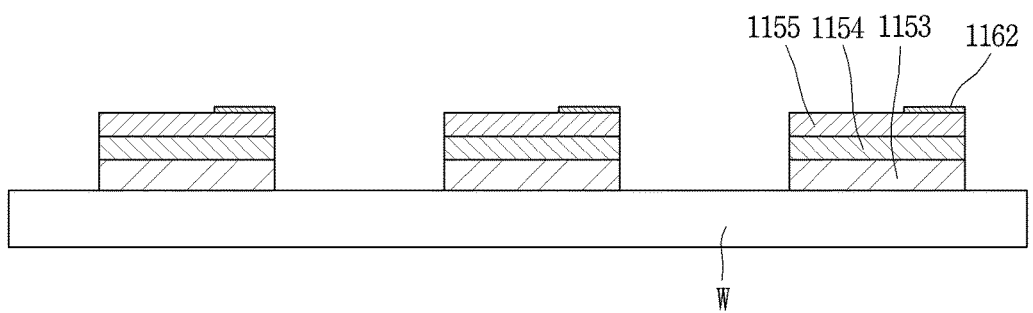
Figure 16D:
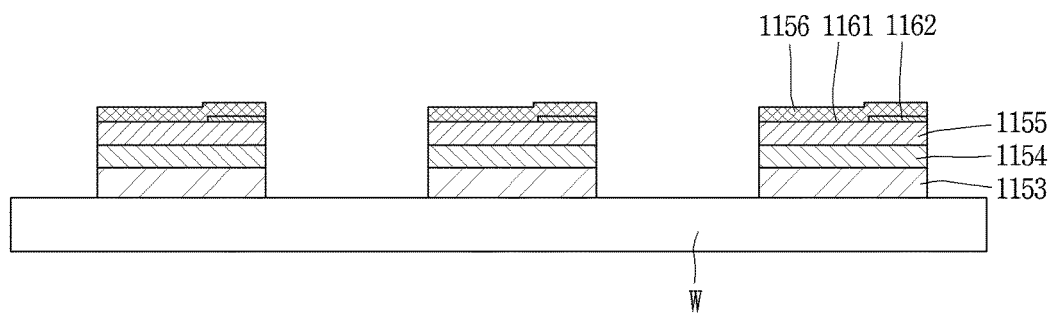

Next, at least one conductive electrode is formed on the semiconductor light-emitting diodes (FIG. 16D). More specifically, the first conductive electrode 1156 is formed on one surface of the first conductive semiconductor layer 1155. In other words, subsequent to forming an array of the semiconductor light-emitting diodes on the substrate, the first conductive electrode 1156 is layered on the first conductive semiconductor layer 1155.

In this case, a connection portion electrically connected to the first conductive electrode is formed on one surface of the first conductive semiconductor layer, and the connection portion is disposed to be biased to one side with respect to the second conductive electrode along a horizontal direction. In order to implement such a structure, prior to forming the first conductive electrode, as illustrated in FIG. 16C, the process of forming the current limiting portion 1162 for preventing current from flowing to the first conductive electrode on the first conductive semiconductor layer 1162 may be carried out.

The current limiting portion 1162 may include a dielectric through which current does not flow, disposed between the first conductive electrode 1156 and the first conductive semiconductor layer 1155. For such an example, the dielectric may be deposited on one surface of the first conductive semiconductor layer 1155 in a region facing the second conductive electrode.

Figure 16E:
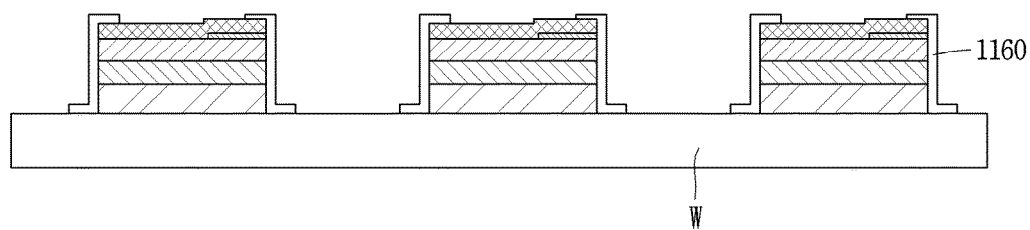

Then, the process of forming the first conductive electrode 1156 is carried out (FIG. 16D), and then a passivation layer 1160 is formed to surround lateral surfaces of the semiconductor light-emitting diodes (FIG. 16E).

The passivation layer 1160 includes a plurality of layers having different refractive indices to reflect light emitted to the lateral surfaces, and a material having a relatively high refractive index and a material having a relatively low refractive index may be repeatedly layered on the plurality of layers.

Then, the process of connecting the first conductive electrode to the wiring substrate and forming the second conductive electrode on the second conductive semiconductor layer is carried out.

Figure 17A:
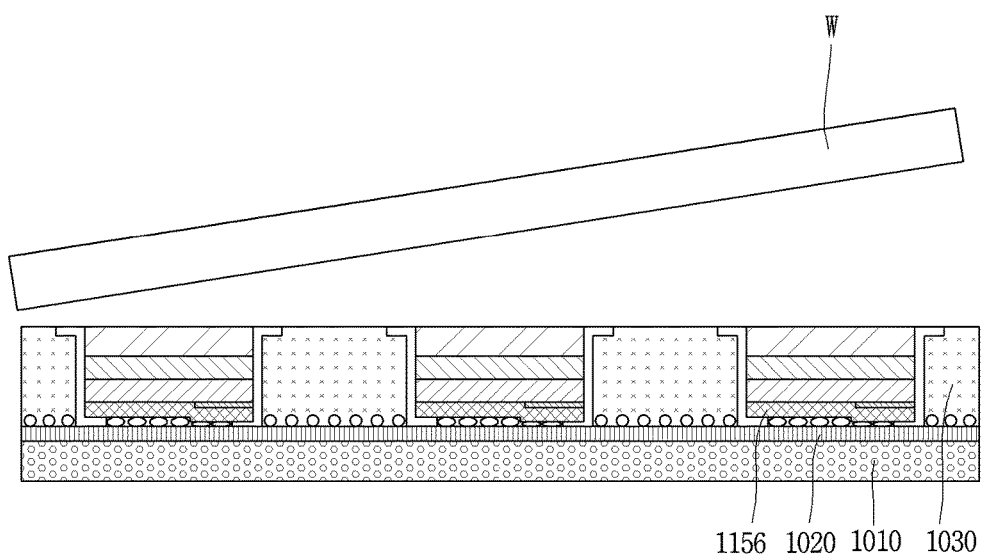
Figure 17B:
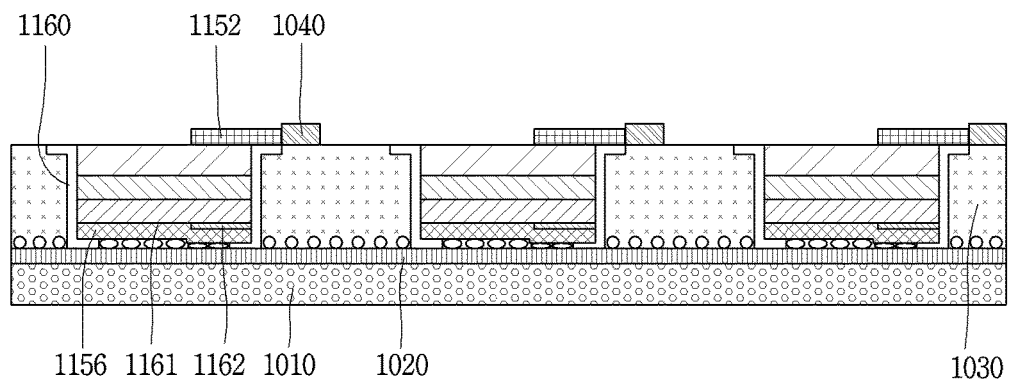

For example, semiconductor light-emitting diodes are bonded to a wiring substrate using a conductive adhesive layer, and the growth substrate is removed (FIG. 17A). The wiring substrate is in a state where the first electrode 1020 is formed, and the first electrode 1020 is electrically connected to the first conductive electrode 1156 by a conductive ball or the like within the conductive adhesive layer 1030 as lower wiring.

Figure 17C:
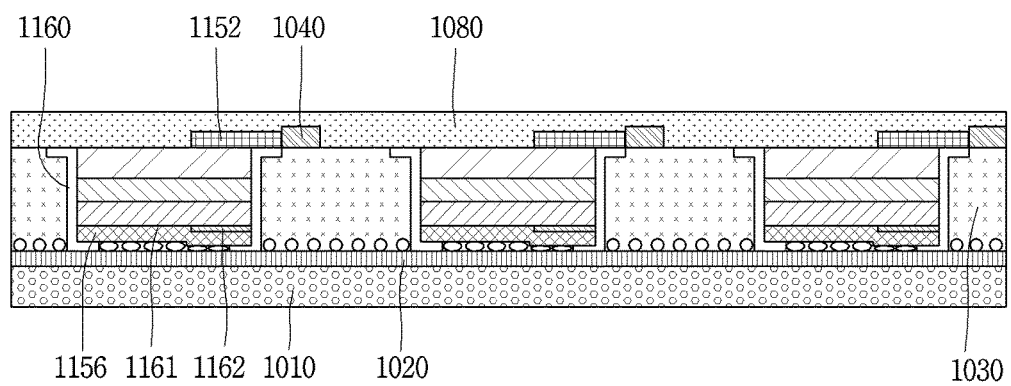

Then, subsequent to depositing the second conductive electrode 1152 on the second conductive semiconductor layer 1153 for each light-emitting device, the second electrode 1040 for connecting the second conductive electrode 1152 of the light-emitting devices is formed (FIG. 17B), and a phosphor layer 1080 is formed to cover the semiconductor light-emitting diode (FIG. 17C). The second electrode 1040 is directly connected to the second conductive electrode 1152 as upper wiring.

According to the manufacturing method described above, as the non-light-emitting region is intentionally formed on the semiconductor light-emitting diode, a luminance improvement of the display device may be implemented though it is a simple manufacturing method.

Meanwhile, a display device using the semiconductor light-emitting element described above may be modified into various forms. Hereinafter, these modifications will be described.

Figure 18:
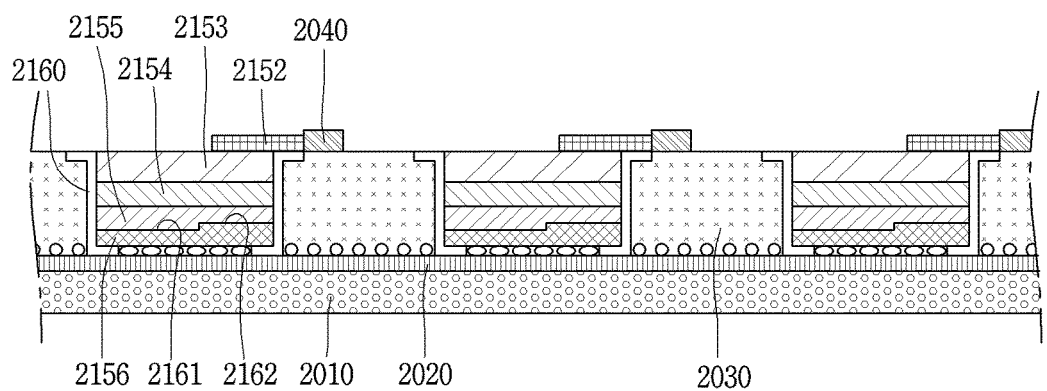
FIG. 18 is a cross-sectional view for explaining another embodiment of the present disclosure.
Figure 19:
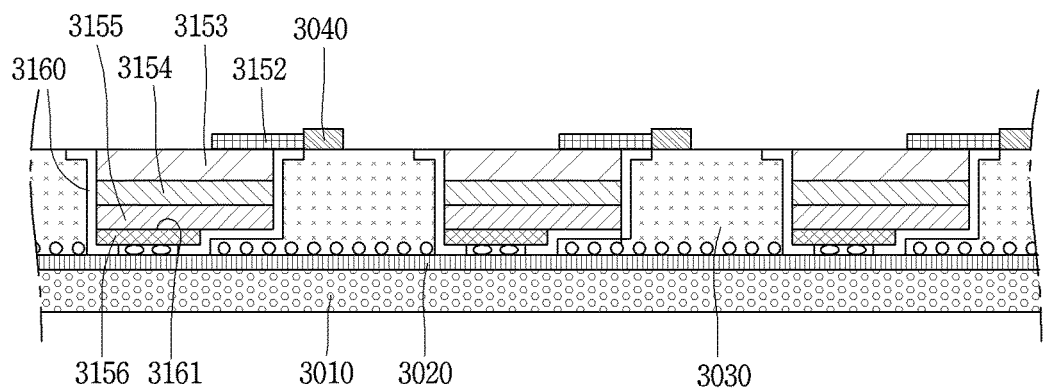
FIG. 19 is a cross-sectional view for explaining still another embodiment of the present disclosure.

FIG. 18 is a cross-sectional view for explaining another embodiment of the present disclosure, and FIG. 19 is a cross-sectional view for explaining still another embodiment of the present disclosure.

According to the drawing in FIG. 18, it is illustrated a display device 2000 using a passive matrix (PM) type semiconductor light-emitting diode as a display device 2000 using a semiconductor light-emitting diode. However, an example described below may also be applicable to an active matrix (AM) type semiconductor light-emitting diode.

The display device 2000 may include a substrate 2010, a first electrode 2020, a conductive adhesive layer 2030, a second electrode 2040, and a plurality of semiconductor light-emitting diodes 2050. Here, the structure, function, and manufacturing method of the substrate 2010, the first electrode 2020, the conductive adhesive layer 2030, and the second electrode 2040 excluding the plurality of light-emitting devices 2050 may be replaced with those of the substrate 1010, the first electrode 1020, the conductive adhesive layer 1030, and the second electrode 1040 in the foregoing example described with reference to FIGS. 10 through 17C, and the description thereof will be substituted by the earlier description.

Furthermore, even in this example, at least one of the semiconductor light-emitting diodes includes a first conductive electrode 2156, a first conductive semiconductor layer 2155 formed with the first conductive electrode 2156, an active layer 2154 formed on the first conductive semiconductor layer 2155, a second conductive semiconductor layer 2153 formed on the active layer 2154, and a second conductive electrode 2152 formed on the second conductive semiconductor layer 2153. The structure, function, and manufacturing method thereof may be replaced with those of the first electrode 1156, the first conductive semiconductor layer 1155, the active layer 1154, and the second conductive semiconductor layer 1153, and the second conductive electrode 1152, and the description thereof will be substituted by the earlier description.

On the other hand, the structure of at least one of the semiconductor light-emitting diodes is formed in such a manner that current flows along a path biased with respect to the vertical direction. For example, a connection portion 2161 electrically connected to the first conductive electrode 2156 is formed on one surface of the first conductive semiconductor layer 2155 (or a lower surface of the first conductive semiconductor layer), and the connection portion 2161 is disposed so as to be biased to one side with respect to the second conductive electrode 2152 along a horizontal direction. The structure, function, and manufacturing method of the connection portion 2161 may be replaced with the connection portion 1161 described in the foregoing example with reference to FIGS. 10 through 17C.

According to the drawings, the first conductive semiconductor layer 2155 may be formed with a current limiting portion 2162 that prevents current from flowing to the first conductive electrode 2156 in order to secure an area of the first conductive electrode 2156 and exhibit the effect of the present example described above.

The first conductive electrode 2156 is formed to cover most of one surface of the first conductive semiconductor layer 2155, and the first conductive semiconductor layer 2155 partially overlaps with the second conductive electrode 2152 in a vertical direction, and the current limiting portion 2162 is formed at a position that overlaps with the second conductive electrode in the vertical direction on the first conductive semiconductor layer 2155.

In this case, a region covered by the first conductive electrode 2156 may be formed on one surface of the first conductive semiconductor layer 2155, and the connection portion 2161 and the current limiting portion 2162 may be respectively positioned in the covering region.

Meanwhile, the current limiting portion 2162 may be a portion where at least part of one surface of the first conductive semiconductor layer is insulated by a plasma process. Therefore, in the manufacturing method of the semiconductor light-emitting diode, the deposition of a dielectric may be replaced with the process of treating plasma on at least part of one surface of the first conductive semiconductor layer.

More specifically, the first conductive semiconductor layer is a p-type GaN layer, and the current limiting portion has a defect which is plasma-treated using oxygen or Cl2 gas on the p-type GaN layer so as to serve as an n-type donor. The defective portion may be an insulator region in which no current flows.

Even in this example, the current limiting portion 2162 may be configured to have a width equal to or greater than that of the second conductive electrode 2152 to completely cover the second conductive electrode 2152 in the vertical direction.

For such an example, assuming that a width of an n-electrode is 20% of an area of the light-emitting device in consideration of the operation voltage and the light extraction efficiency of the semiconductor light-emitting diode, it is effective that a width of the current limiting portion should be larger than the n-electrode area, and formed in a range not exceeding 30% of an area of a p-electrode. For a more specific example, a size of individual semiconductor light-emitting diodes is a vertical structure of 20 and 40 um in width and length, a size of the n-electrode is 20 and 8 um in width and length, and a size of the current limiting portion is 20, 8 to 10.4 um in width and length.

As in this example, when a region where no current flows is formed by making a defect on a lower surface of the p-type GaN layer of the semiconductor light-emitting diode in which current is concentrated, light concentrated around the electrode may be dispersed.

On the other hand, as illustrated in FIG. 19, a method of controlling a size of the p-type electrode to intentionally form a non-light-emitting region is also possible. In other words, the P-type electrode can be manufactured to have a size that does not overlap with the n-electrode wiring.

In this example, it is illustrated a display device 2000 using a passive matrix (PM) type semiconductor light-emitting diode as a display device 3000 using a semiconductor light-emitting diode. However, an example described below may also be applicable to an active matrix (AM) type semiconductor light-emitting diode.

The display device 3000 may include a substrate 3010, a first electrode 3020, a conductive adhesive layer 3030, a second electrode 3040, and a plurality of semiconductor light-emitting diodes 3050. Here, the structure, function, and manufacturing method of the substrate 3010, the first electrode 3020, the conductive adhesive layer 3030, and the second electrode 3040 may be replaced with those of the substrate 1010, the first electrode 1020, the conductive adhesive layer 1030, and the second electrode 1040 in the foregoing example described with reference to FIGS. 10 through 17C, and the description thereof will be substituted by the earlier description.

Furthermore, at least one of the semiconductor light-emitting diodes includes a first conductive electrode 3156, a first conductive semiconductor layer 3155 formed with the first conductive electrode 3156, an active layer 3154 formed on the first conductive semiconductor layer 3155, a second conductive semiconductor layer 3153 formed on the active layer 3154, and a second conductive electrode 3152 formed on the second conductive semiconductor layer 3153.

In this example, the relative sizes and relative positions of the first conductive electrode 3156, the first conductive semiconductor layer 3155, and the second conductive electrode 3152 are different from those described above with reference to FIGS. 10 through 17C.

More specifically, the first conductive electrode 3156 and the second conductive electrode 3152 are disposed so as not to overlap with each other along the vertical direction. However, the present disclosure is not limited thereto, and the first conductive electrode 3156 and the second conductive electrode 3152 may be formed so that only a part thereof overlaps along the vertical direction. In this case, the current limiting portion is not formed separately, and therefore, the process of forming the current limiting portion is omitted in the manufacturing method of the semiconductor light-emitting diode, and the first conductive electrode 3156 has a different size and position in the process of forming the first conductive electrode 3156.

Furthermore, in this example, a connection portion 3161 may be formed on an entire boundary portion between the first conductive electrode 3156 and the first conductive semiconductor layer 3155.

For this purpose, the first conductive electrode 3156 may be disposed adjacent to one side of at least one of the semiconductor light-emitting diodes, and the second conductive electrode 3152 may be disposed adjacent to the other side thereof. Even in the structure of this example, a current between the first conductive electrode 3156 and the second conductive electrode 3152 may flow in a biased manner to a portion of the active layer 3154 facing the connection portion 3161 (or a portion facing the first conductive electrode). Therefore, in this example, it may be possible to mitigate or prevent light loss around the wiring electrode using the size of the first conductive electrode 3156, and as a result, the luminance of the display device may be greatly improved.

The configurations and methods according to the above-described embodiments will not be applicable in a limited way to the foregoing display device using a semiconductor light-emitting diode, and all or part of each embodiment may be selectively combined and configured to make various modifications thereto.

What is claimed is:

1. A display device having a plurality of semiconductor light-emitting diodes, wherein at least one of the semiconductor light-emitting diodes comprises:

a first conductive electrode and a second conductive electrode;

a first conductive semiconductor layer on which the first conductive electrode is disposed;

a second conductive semiconductor layer configured to overlap with the first conductive semiconductor layer in a vertical direction, on which the second conductive electrode is disposed; and an active layer disposed between the first conductive semiconductor layer and the second conductive semiconductor layer, wherein a connection portion electrically connected to the first conductive electrode is formed on one surface of the first conductive semiconductor layer, and the connection portion is disposed to be biased to one side with respect to the second conductive electrode along a horizontal direction, wherein the display device has a front surface on which visual information is displayed, and wherein the second conductive semiconductor layer is disposed closer to the front surface than the first conductive semiconductor layer.

2. The display device of claim 1, wherein at least one of the semiconductor light-emitting diodes is configured to flow a current between the first conductive electrode and the second conductive electrode to a portion of the active layer facing the connection portion in a biased manner as the connecting portion is biased to one side.

3. The display device of claim 2, wherein the portion of the active layer facing the connection portion is disposed in such a manner that the connection portion is adjacent to one side of at least one of the semiconductor light-emitting diodes, and the second conductive electrode is adjacent to the other side thereof not to overlap with the second conductive electrode.

4. The display device of claim 1, wherein the first conductive semiconductor layer is formed with a current limiting portion that prevents current from flowing to the first conductive electrode.

5. The display device of claim 4, wherein the current limiting portion is formed at a position that overlaps with the second conductive electrode in the vertical direction.

6. The display device of claim 5, wherein the current limiting portion is configured to have a width equal to or greater than that of the second conductive electrode to completely cover the second conductive electrode in the vertical direction.

7. The display device of claim 4, wherein a region covered by the first conductive electrode is formed on one surface of the first conductive semiconductor layer, and the connection portion and the current limiting portion are respectively positioned in the covering region.

8. The display device of claim 4, wherein the current limiting portion includes a dielectric disposed between the first conductive electrode and the first conductive semiconductor layer.

9. The display device of claim 8, wherein the dielectric is deposited on one surface of the first conductive semiconductor layer.

10. The display device of claim 8, wherein the dielectric comprises $SiO_2$ or SiN.

11. The display device of claim 4, wherein the current limiting portion is a portion in which at least part of one surface of the first conductive semiconductor layer is insulated by a plasma treatment.

12. The display device of claim 11, wherein the first conductive semiconductor layer is a p-type GaN layer, and the current limiting portion is a defect that is plasma-treated on the p-type GaN layer to serve as an N-type donor.

13. The display device of claim 1, wherein the first conductive electrode and the second conductive electrode are disposed so as not to overlap with each other along the vertical direction.

14. The display device of claim 1, wherein a first region in which the connection portion is disposed and a second region that is electrically insulated between the first conductive electrodes are formed on one surface of the first conductive semiconductor layer.

15. A method of manufacturing a display device, the method comprising:
   growing a first conductive semiconductor layer, an active layer, and a second conductive semiconductor layer on a substrate;
   isolating semiconductor light-emitting diodes on the substrate through etching;
   depositing a first conductive electrode on one surface of the first conductive semiconductor layer of the semiconductor light-emitting diodes; and
   connecting the first conductive electrode to a wiring substrate and forming a second conductive electrode on the second conductive semiconductor layer,
   wherein a connection portion electrically connected to the first conductive electrode is formed on one surface of the first conductive semiconductor layer, and the connection portion is disposed to be biased to one side with respect to the second conductive electrode along a horizontal direction,
   wherein the display device has a front surface on which visual information is displayed, and
   wherein the second conductive semiconductor layer is disposed closer to the front surface than the first conductive semiconductor layer.

16. The method of claim 15, further comprising:
   forming a current limiting portion that prevents current from flowing to the first conductive electrode on the first conductive semiconductor layer.

* * * * *